United States Patent
Bhattacharyya et al.

[11] Patent Number: 5,982,660
[45] Date of Patent: Nov. 9, 1999

[54] MAGNETIC MEMORY CELL WITH OFF-AXIS REFERENCE LAYER ORIENTATION FOR IMPROVED RESPONSE

[75] Inventors: Manoj K. Bhattacharyya, Cupertino; James A. Brug, Menlo Park, both of Calif.

[73] Assignee: Hewlett-Packard Company, Palo Alto, Calif.

[21] Appl. No.: 09/140,992

[22] Filed: Aug. 27, 1998

[51] Int. Cl.⁶ .................................................. G11C 11/15
[52] U.S. Cl. .............................. 365/173; 365/66; 365/74; 365/55
[58] Field of Search ..................... 365/171, 158, 365/173, 66, 172, 157, 55, 74, 32, 33; 360/113; 357/71

[56] References Cited

U.S. PATENT DOCUMENTS

| | | | |
|---|---|---|---|
| 5,107,099 | 4/1992 | Smith | 235/449 |
| 5,587,943 | 12/1996 | Torok et al. | 365/158 |
| 5,633,770 | 5/1997 | Che | 360/113 |

Primary Examiner—David Nelms
Assistant Examiner—Thong Le

[57] ABSTRACT

A magnetic memory cell including a data storage layer having an easy axis and a reference layer having an orientation of magnetization which is pinned in a direction that is off-axis with respect to the easy axis. This structure increases the signal obtainable during read operation on the magnetic memory cell notwithstanding the effects of magnetizations in the edge domains of the data storage layer. In addition, this structure allows high MRAM densities to be achieved using square-shaped memory cell structures.

20 Claims, 3 Drawing Sheets

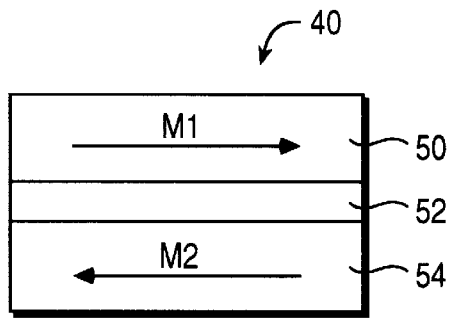
FIG. 1
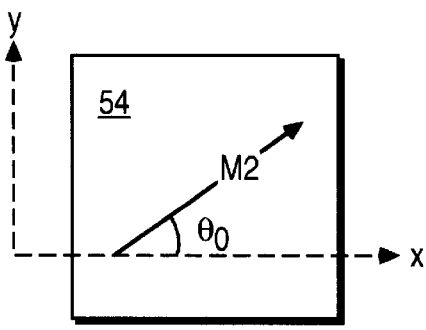
FIG. 2
FIG. 3A
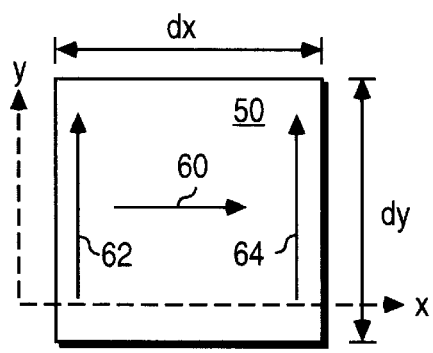
FIG. 3B
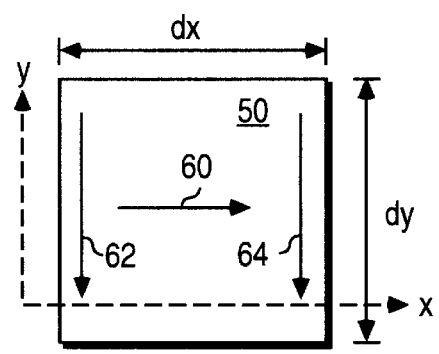
FIG. 4A
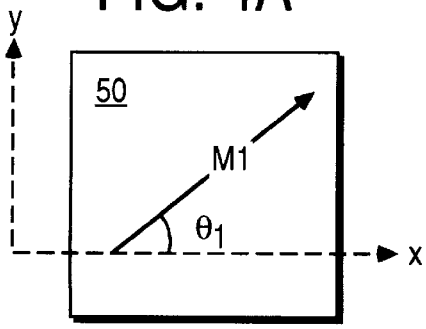
FIG. 4B
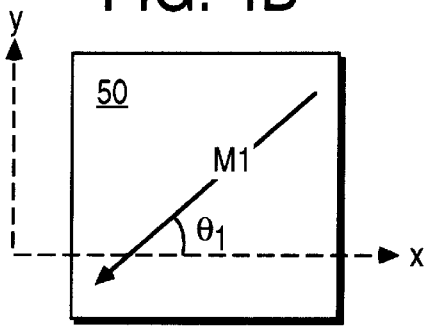

MAGNETIC MEMORY CELL WITH OFF-AXIS REFERENCE LAYER ORIENTATION FOR IMPROVED RESPONSE

BACKGROUND OF THE INVENTION

1. Field of Invention

The present invention pertains to the field of magnetic memories. More particularly, this invention relates to a magnetic memory cell with a reference layer having off-axis orientation.

2. Art Background

A magnetic memory such as a magnetic random access memory (MRAM) typically includes an array of magnetic memory cells. Each magnetic memory cell usually includes a data storage layer and a reference layer. Typically, the logic state of a magnetic memory cell depends on the relative orientations of magnetization in its data storage and reference layers.

The data storage layer of a magnetic memory cell is usually a layer or film of magnetic material that stores alterable magnetization states. These alterable magnetization states typically include magnetizations which form in a direction that is parallel to what is commonly referred to as the easy axis of the data storage layer. A data storage layer also usually includes magnetizations which form near its edges including edges that are perpendicular to its easy axis. The magnetizations which form near the perpendicular edges are commonly referred to as edge domains. The resulting orientation of magnetization in the data storage layer is a result of the effects of the magnetizations along the easy axis and the effects of perpendicular magnetizations in the edge domains.

The reference layer of a magnetic memory cell is usually a layer of magnetic material in which magnetization is fixed or "pinned" in a particular direction. In a typical prior magnetic memory cell, the reference layer is formed so that its magnetization is pinned in a direction which is parallel to the easy axis of the data storage layer. As a consequence, the orientation of magnetization in the reference layer of a prior magnetic memory cell is typically parallel to the easy axis of the data storage layer.

A magnetic memory cell is typically in a low resistance state if the orientation of magnetization in its data storage layer is parallel to the orientation of magnetization in its reference layer. In contrast, a magnetic memory cell is typically in a high resistance state if the orientation of magnetization in its data storage layer is anti-parallel to the orientation of magnetization in its reference layer.

A prior magnetic memory cell is usually written by applying external magnetic fields that rotate the orientation of magnetization in the data storage layer from one direction to the other along its easy axis. This causes the magnetic memory cell to switch between its high and low resistance states. The logic state of the magnetic memory cell may be determined during a read operation by measuring its resistance.

Unfortunately, the effects of the edge domains in such a magnetic memory cell usually cause the resulting orientation of magnetization in the data storage layer to move away from its easy axis. This usually reduces the difference between the high and low resistance state of the magnetic memory cell and decreases the signal obtained during read operations. Such a decrease in signal usually increases the bit error rate in an MRAM.

One prior solution for minimizing these negative effects of edge domains is to form the data storage layer as a rectangle with an elongated dimension along its easy axis. Such a structure usually increases easy axis contribution to the resulting orientation of magnetization in the data storage layer in comparison to contributions from the edge domains. Unfortunately, such a rectangular configuration usually requires more energy to flip the orientation of magnetization in the data storage layer during write operations, thereby causing an increase in power consumption in a MRAM that uses such a structure. In addition, such rectangular magnetic memory cells usually limit the overall memory cell density that may be obtained in an MRAM.

SUMMARY OF THE INVENTION

A magnetic memory cell is disclosed including a data storage layer having an easy axis and a reference layer having an orientation of magnetization which is pinned in a direction that is off-axis with respect to the easy axis. This structure increases the signal obtainable during read operation on the magnetic memory cell notwithstanding the effects of edge domains of the data storage layer. In addition, this structure allows high MRAM densities to be achieved using square-shaped structures.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 1 illustrates the basic structure of a magnetic memory cell having a reference layer with an off-axis orientation of magnetization with respect to the easy axis of its data storage layer;

FIG. 2 shows a top view of the reference layer of the magnetic memory cell having off-axis orientation;

FIGS. 3a–3b illustrate the magnetization states in the data storage layer for two logic states of the magnetic memory cell;

FIGS. 4a–4b illustrate the resulting M1 vector for two logic states of the magnetic memory cell;

DETAILED DESCRIPTION

Figure 5A:
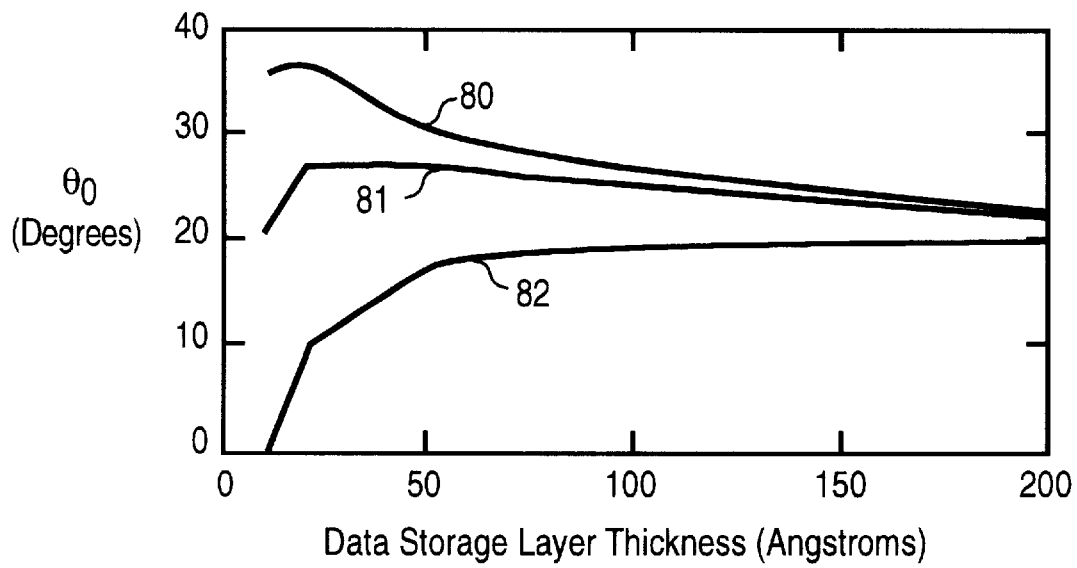
FIGS. 5a–5b illustrate the effects of the off-axis orientation of M2 with respect to the easy axis of the data storage layer.

FIG. 1 illustrates the basic structure of a magnetic memory cell 40 having a reference layer 54 with an off-axis orientation of magnetization with respect to the easy axis of a data storage layer 50. The degree or angle of off-axis orientation of the reference layer 54 with respect to the easy axis of the data storage layer 50 is selected to enhance the signal obtainable during read operations on the magnetic memory cell 40.

In one embodiment, the magnetic memory cell 40 includes a tunnel barrier 52 between the data storage layer 50 and the reference layer 54. This structure of the magnetic memory cell 40 may be referred to as a spin tunneling device in that electrical charge migrates through the tunnel barrier 52 during read operations. This electrical charge migration through the tunnel barrier 52 is due to a phenomenon known as spin tunneling and occurs when a read voltage is applied to the magnetic memory cell 40. In an alternative embodiment, a giant magneto-resistive (GMR) structure may be used in the magnetic memory cell 40.

The logic states of the magnetic memory cell 40 correspond to the relative orientations of magnetization in the data storage layer 50 and the reference layer 54. The overall or resulting orientation of magnetization in the data storage layer 50 is represented by a vector M1. M1 includes contributions from magnetizations along the easy axis and in the edge domains of the data storage layer 50. The orientation of magnetization in the reference layer 54 is represented by a vector M2 which is fixed in a particular direction which is off-axis with respect to the easy axis of the data storage layer 50.

The resulting M1 vector changes depending upon the logic state of the magnetic memory cell 40. The resulting M1 vector is manipulated by the application of external magnetic fields using conductors associated with the magnetic memory cell 40. These external magnetic fields are applied to flip or rotate the directions of the magnetizations in the data storage layer 50 including the easy axis magnetization and the edge domains.

The logic state of the magnetic memory cell 40 is determined by measuring its resistance which differs according to the relative orientations of M1 and M2. The resistance of the magnetic memory cell 40 may be detected by applying a read voltage and measuring a resulting sense current.

FIG. 2 shows a top view of the reference layer 54 of the magnetic memory cell 40. Also shown is the M2 vector which represents the fixed orientation of magnetization of the reference layer 54. The M2 vector forms an angle $\theta_0$ with respect to an x axis. The M2 vector is off-axis in that the easy axis of the data storage layer 50 is parallel to the x axis.

The off-axis orientation of magnetization M2 according to the angle $\theta_0$ may be realized using a variety of known techniques. For example, the reference layer 54 may be permalloy layer (NiFe) which is coupled to an antiferromagnetic layer that pins the orientation of magnetization in the permalloy layer in the direction defined by the angle $\theta_0$. The antiferromagnetic material may be iron-manganese (FeMn) or nickel-manganese (NiMn). Alternative materials for the antiferromagnetic material include NiO, TbCo, PtMn, and IrMn.

The angle $\theta_0$ of M2 may be accomplished by applying a strong magnetic field such as 1000 oersteds in a direction parallel to the desired M2 vector and heating the magnetic memory cell 40 to a high temperature such as 200 degrees C. The magnetic memory cell 40 is then cooled in the presence of this magnetic field to fix the orientation of magnetization in the antiferromagnetic material in a direction parallel to the desired angle $\theta_0$. Magnetic exchange coupling between the annealed antiferromagnetic material and the permalloy material of the reference layer 54 pins M2 to the desired angle $\theta_0$.

Alternatively, the reference layer 54 may be a material with a high coercivity such as a cobalt-platinum alloy. A magnetic field of sufficient strength may be applied to the reference layer 54 to fix the orientation of magnetization M2 to the desired angle $\theta_0$. The relatively high coercivity of the reference layer 54 would prevent switching of M2 in the presence of external magnetic fields that are applied during write operations to the magnetic memory cell 40.

FIGS. 3a–3b illustrate the magnetizations in the data storage layer 50 for two logic states of the magnetic memory cell 40. FIG. 3a shows a first logic state and FIG. 3b shows a second logic state of the magnetic memory cell 40. A vector 60 represents the magnetizations along the easy axis of the data storage layer 50 which is parallel to the x axis. A pair of vectors 62 and 64 represent the magnetizations in the perpendicular edge domains of the data storage layer 50. The vectors 62 and 64 are perpendicular to the easy axis of the data storage layer 50 and are parallel to the y axis.

In the first logic state the edge domain fields represented by the vectors 62 and 64 are in the positive y direction and in the second logic state the edge domain fields are in the negative y direction. Rather than try to minimize the effects of the edge domain fields by elongating the data storage layer as in the prior art, the magnetic memory cell 40 takes into account the edge domain fields for the selection of the angle $\theta_0$ to enhance the signal that my be obtained during a read operation.

FIGS. 4a–4b illustrate the resulting M1 vector for two logic states of the magnetic memory cell 40. The resulting M1 vector takes into account the contributions of the magnetizations corresponding to the vectors 60–64 in the data storage layer 50. FIG. 4a shows the resulting M1 vector for the first logic state and FIG. 4b shows the resulting M1 vector for the second logic state of the magnetic memory cell 40.

The resulting M1 vector flips between the two logic-states under the influence of externally applied magnetic fields. The signal obtained from the magnetic memory cell 40 during a read operation is maximized if the angles $\theta_0$ and $\theta_1$ are substantially equal. This causes M1 to rotate about the off-axis angle $\theta_0$ and be either parallel or anti-parallel to M2.

The magnetic memory cell 40 is written to the first logic state by applying an external magnetic field that flips the edge domain vectors 62 and 64 to the positive y direction and by applying an external magnetic field that flips the easy axis vector 60 to the positive x direction. This results in an M1 vector in the positive x and positive y direction with an angle $\theta_1$ with respect to the x axis as shown.

The magnetic memory cell 40 is written to the second logic state by applying an external magnetic field that flips the edge domain vectors 62 and 64 to the negative y direction and by applying an external magnetic field that flips the easy axis vector 60 to the negative x direction. This results in an M1 vector in the negative x and negative y direction with an angle $\theta_1$ with respect to the x axis as shown.

Figure 5B:
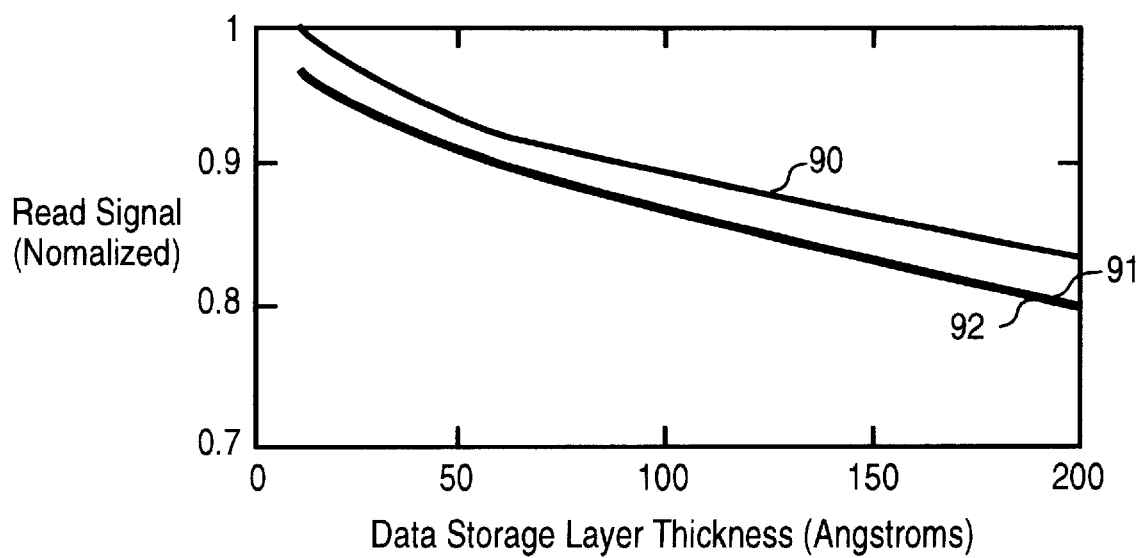

FIGS. 5a–5b illustrate the effects of the off-axis orientation of M2 with respect to the easy axis of the data storage layer 50. These effects vary according to the crystalline anisotropy value (Hk) of the data storage layer 50 and the thickness of the data storage layer 50.

FIG. 5a shows the relationship between the angle $\theta_0$ and the thickness of the data storage layer 50 for differing values of Hk. A series of curves 80–82 depict the optimum pinned angle $\theta_0$ for Hk values of 5, 20 and 100 Oe, respectively. The curves 80–82 may be used to select an optimum pinned angle $\theta_0$ for a given thickness of the data storage layer 50 and a given Hk value of the data storage layer 50.

FIG. 5b shows the relationship between the read signal obtained from the magnetic storage cell 40 and the thickness of the data storage layer 50 for differing Hk values of the data storage layer 50 at the optimum pinned angle $\theta_0$ selected using the curves 80–82. A series of curves 90–92 represent Hk values of 100, 20 and 5 Oe, respectively.

The dimensions $d_x$ and $d_y$ are selected to be substantially equal and form a square shape for the data storage layer 50. The square shape of the data storage layer 50 enhances the density that may be obtained in an MRAM in comparison to that which may be obtained when using rectangular memory cells. This is so because for a given minimum feature size more square magnetic memory cells may be formed on a given substrate area than rectangular magnetic memory cells.

Figure 6:
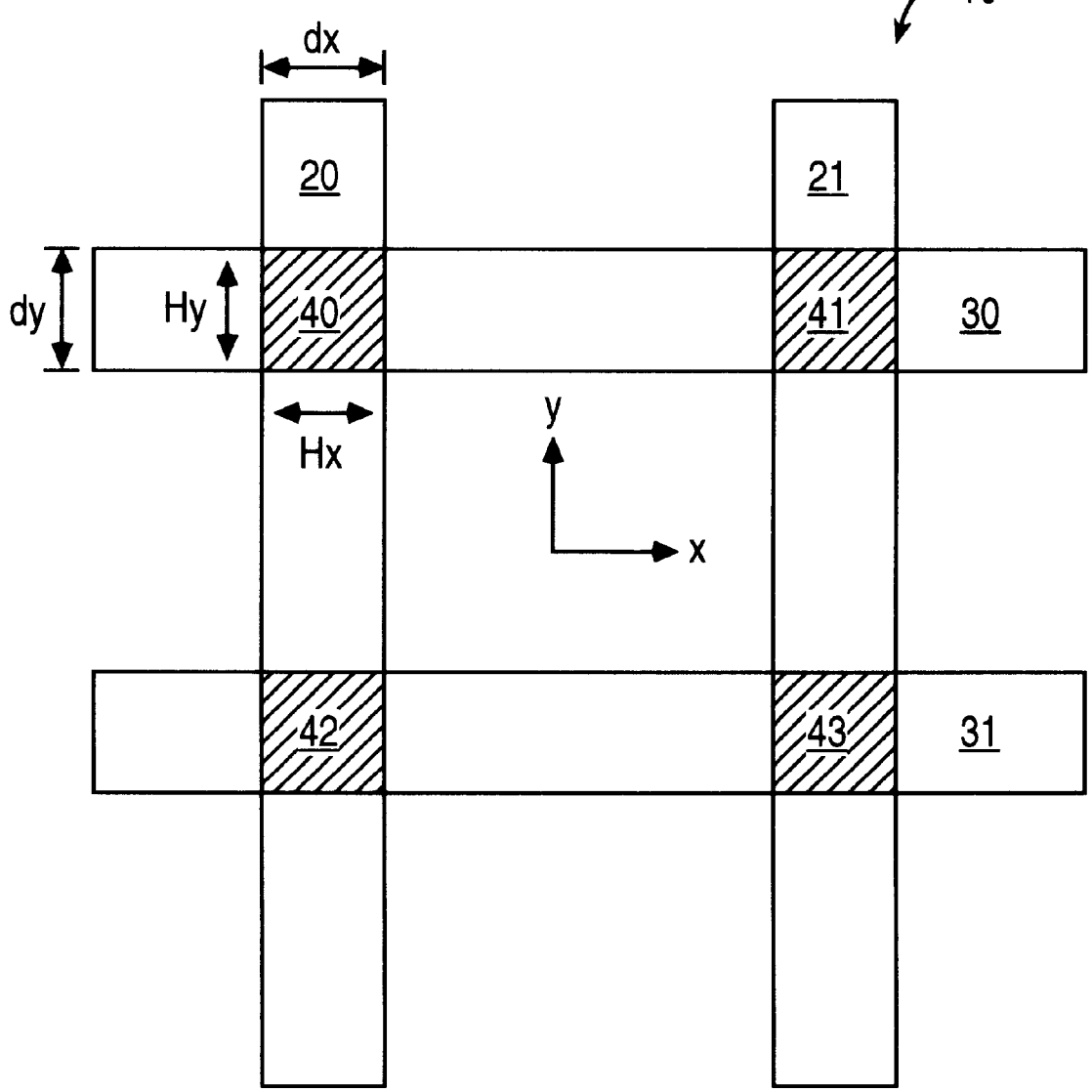
FIG. 6 is a top view of a magnetic memory which includes an array of magnetic memory cells.

FIG. 6 is a top view of a magnetic memory 10 which includes an array of magnetic memory cells comprising the magnetic memory cell 40 along with additional magnetic memory cells 41–43. The magnetic memory 10 also includes an array of conductors 20–21 and 30–31 that enable read and write access to the magnetic memory cells 40–43. The conductors 30–31 are top conductors and the conductors 20–21 are orthogonal bottom conductors. Each of the magnetic memory cells 40–43 has dimensions $d_x$ and $d_y$.

The logic states of the magnetic memory cells 40–43 are manipulated by applying electrical currents to the conductors 20–21 and 30–32. For example, an electrical current applied to the conductor 30 in the +x direction causes a magnetic field ($H_{y+}$) in the data storage layer 50 in the +y direction according to the right-hand rule. An electrical current applied to the conductor 30 in the –x direction causes a magnetic field ($H_{y-}$) in the data storage layer 50 in the –y direction. Similarly, an electrical current applied to the conductor 20 in the +y direction causes a magnetic field ($H_{x+}$) in the data storage layer 50 in the +x direction, while an electrical current applied to the conductor 20 in the –y direction causes a magnetic field ($H_{x-}$) in the data storage layer 50 in the –x direction. These induced magnetic fields $H_{x+}$, $H_{x-}$, $H_{y+}$, and $H_{y-}$ may be used to alter the directions of the vectors 60–64, thereby changing the logic state of the magnetic memory cell 40.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A magnetic memory cell, comprising:
    data storage layer having an easy axis;
    reference layer having an orientation of magnetization which is pinned in a direction that is off-axis with respect to the easy axis such that the direction is not substantially parallel or substantially anti-parallel or substantially perpendicular to the easy axis.

2. The magnetic memory cell of claim 1, wherein the direction is substantially parallel to a vector which results from a magnetization in the data storage layer along the easy axis and a set of magnetizations in the data storage layer which are perpendicular to the easy axis.

3. The magnetic memory cell of claim 2, wherein a logic state of the magnetic memory cell is written by applying a sequence of external fields which rotates the magnetizations along the easy axis and the magnetizations which are perpendicular to the easy axis.

4. The magnetic memory cell of claim 2, wherein a first logic state is written by applying a sequence of external fields which rotates the magnetizations along the easy axis to a direction that is substantially parallel to an x component of the orientation of magnetization in the reference layer and which rotates the magnetizations which are perpendicular to the easy axis to a direction that is substantially parallel to a y component of the orientation of magnetization in the reference layer.

5. The magnetic memory cell of claim 2, wherein a second logic state is written by applying a sequence of external fields which rotates the magnetizations along the easy axis to a direction that is substantially anti-parallel to an x component of the orientation of magnetization in the reference layer and which rotates the magnetizations which are perpendicular to the easy axis to a direction that is substantially anti-parallel to a y component of the orientation of magnetization in the reference layer.

6. The magnetic memory cell of claim 1, wherein the direction is preselected based on a thickness of the data storage layer.

7. The magnetic memory cell of claim 1, wherein the direction is preselected based on a crystalline anisotropy of the data storage layer.

8. A magnetic memory, comprising:
    an array of magnetic memory cells each having a data storage layer with an easy axis and a reference layer having an orientation of magnetization which is pinned in a direction that is off-axis with respect to the easy axis such that the direction is not substantially parallel or substantially anti-parallel or substantially perpendicular to the easy axis;
    a set of conductors that enable read and write access to the magnetic memory cells.

9. The magnetic memory of claim 8, wherein the direction is substantially parallel to a vector which results from a magnetization in the data storage layer along the easy axis and a set of magnetizations in the data storage layer which are perpendicular to the easy axis.

10. The magnetic memory of claim 9, wherein a logic state of a particular one of the magnetic memory cells is written by applying a sequence of external fields using the conductors to rotate the magnetizations of the data storage layer of the particular one of the magnetic memory cells along the easy axis and to rotate the magnetizations of the data storage layer of the particular one of the magnetic memory cells which are perpendicular to the easy axis.

11. The magnetic memory of claim 9, wherein a first logic state of a particular one of the magnetic memory cells is written by applying a sequence of external fields using the conductors to rotate the magnetizations of the data storage layer of the particular one of the magnetic memory cells along the easy axis to a direction that is substantially parallel to an x component of the orientation of magnetization in the reference layer of the particular one of the magnetic memory cells and to rotate the magnetizations of the data storage layer of the particular one of the magnetic memory cells which are perpendicular to the easy axis to a direction that is substantially parallel to a y component of the orientation of magnetization in the reference layer of the particular one of the magnetic memory cells.

12. The magnetic memory of claim 9, wherein a second logic state of a particular one of the magnetic memory cells is written by applying a sequence of external fields using the conductors to rotate the magnetizations of the data storage layer of the particular one of the magnetic memory cells along the easy axis to a direction that is substantially anti-parallel to an x component of the orientation of magnetization in the reference layer of the particular one of the magnetic memory cells and to rotate the magnetizations of the data storage layer of the particular one of the magnetic memory cells which are perpendicular to the easy axis to a direction that is substantially anti-parallel to a y component of the orientation of magnetization in the reference layer of the particular one of the magnetic memory cells.

13. The magnetic memory of claim 8, wherein the direction is preselected based on a thickness of the data storage layers.

14. The magnetic memory of claim 8, wherein the direction is preselected based on a crystalline anisotropy of the data storage layers.

15. A method for providing a magnetic memory cell with improved response comprising the step of forming a reference layer of the magnetic memory cell with an orientation of magnetization which is pinned in a direction that is off-axis with respect to an easy axis of a data storage layer of the magnetic memory cell such that the direction is not substantially parallel or substantially anti-parallel or substantially perpendicular to the easy axis.

16. The method of claim 15, wherein the step of forming a reference layer comprises the step of forming a reference layer with an orientation of magnetization which is pinned in a direction that is substantially parallel to a vector which results from a magnetization in the data storage layer along the easy axis and a set of magnetizations in the data storage layer which are perpendicular to the easy axis.

17. The method of claim 15, wherein the step of forming a reference layer includes the step of selecting the direction based on a thickness of the data storage layer.

18. The method of claim 15, wherein the step of forming a reference layer includes the step of selecting the direction based on a crystalline anisotropy of the data storage layer.

19. The method of claim 15, wherein the step of forming a reference layer comprises the steps of:

applying a strong magnetic field to the reference layer in a direction parallel to the direction that is off-axis;

heating the reference layer to a high temperature;

cooling the reference layer in the presence of the strong magnetic field to fix the orientation of magnetization of the reference layer.

20. The method of claim 15, wherein the step of forming a reference layer comprises the steps of:

forming the reference layer with a material having a high coercivity;

applying a magnetic field to the reference layer to fix the orientation of magnetization of the reference layer to the direction that is off-axis.

* * * * *